(12) United States Patent
Yu

(10) Patent No.: US 6,284,582 B1
(45) Date of Patent: Sep. 4, 2001

(54) MOS-GATE TUNNELING-INJECTION BIPOLAR TRANSISTOR

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/398,246

(22) Filed: Sep. 17, 1999

(51) Int. Cl.[7] .............................................. H01L 21/8238
(52) U.S. Cl. ........................................... 438/202; 438/234
(58) Field of Search .................................. 438/204, 234, 438/525, 375, 325, 302, 133, 135

(56) References Cited

U.S. PATENT DOCUMENTS

| | | | |
|---|---|---|---|
| 5,270,227 | * 12/1993 | Kamayama et al. . | |
| 5,342,794 | * 8/1994 | Wei | 438/374 |
| 5,728,613 | * 3/1998 | Hsu et al. | 438/204 |
| 6,043,130 | * 3/2000 | Gregory | 438/350 |
| 6,127,236 | * 10/2000 | Prall et al. | 438/204 |
| 6,214,666 | * 4/2001 | Mehta | 438/257 |

* cited by examiner

*Primary Examiner*—Tuan H. Nguyen
(74) *Attorney, Agent, or Firm*—Foley & Lardner

(57) ABSTRACT

A method of forming a metal oxide semiconductor (MOS)-controlled bipolar transistor includes tilt angle implanting a first impurity into a semiconductor substrate and implanting a second impurity into the semiconductor substrate to form an emitter and a collector. A corresponding transistor arranged as to combine the large current drive capacity of a bipolar junction transistor (BJT) with the smaller device size of a metal oxide semiconductor field effect transistor (MOSFET) is also provided. The transistor includes a semiconductor structure, a gate located proximate the semiconductor structure, a gate insulator disposed intermediate the semiconductor structure and the gate, a source region located in the semiconductor structure, a drain region located in the semiconductor structure, and a buffer region located in the semiconductor structure proximate the drain region.

5 Claims, 4 Drawing Sheets

MOS-GATE TUNNELING-INJECTION BIPOLAR TRANSISTOR

FIELD OF THE INVENTION

The present invention relates to integrated circuits and to methods of manufacturing integrated circuits. More particularly, the present invention relates to a metal oxide semiconductor (MOS) controlled bipolar transistor and a method of manufacturing such a transistor.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FET). As the critical dimensions of ULSI circuits become smaller and smaller, transistor drive current is critical in determining overall integrated circuit speed and performance.

One of the factors that affects transistor drive current is the device architecture used in the transistor. In concurrent integration technology, CMOS FET (Complementary Metal-Oxide-Semiconductor Field-Effect Transistor) device architecture is typically considered to be dominant. CMOS FET architecture, however, has some limitations. First, the thickness of the gate dielectric is non-scalable. When the gate dielectric or gate oxide thickness is reduced to below 15Å, significant leakage current occurs due to a direct tunneling mechanism (i.e., charge carriers tunnel through the thin trapezoid potential barrier of gate oxide). The severe gate leakage current makes the MOS gate less capacitive but more resistive, therefore degrading the current drive due to a smaller amount of charge induced in the inversion channel. Second, MOSFETs are uni-polar devices. As such, only one type of carrier (either electron or hole) contributes to the channel conduction current, limiting the current drive capability.

In contrast, the Bipolar Junction transistor (BJT), used widely in the early stage of integrated circuit history, provides larger current drive capability due to its bipolar nature. That is, both types of charge carriers (i.e., electrons and holes) contribute to the current conduction. However, the BJT requires a relatively large amount of substrate area compared to MOSFETs. Accordingly, BJTs are not significantly utilized in ultra-large scale integration (ULSI) because of its large area consumption for a single device or transistor.

Thus, there is a need for a transistor architecture that combines the advantages of MOSFETs and BJTs, while attempting to avoid the disadvantages of both types of devices. Even further, there is a need for utilizing the direct tunneling leakage current through the ultra-thin gate dielectric as the base injection current for a lateral bipolar junction transistor built underneath the gate stack.

SUMMARY OF THE INVENTION

One embodiment relates to a method of forming a metal oxide semiconductor (MOS)-controlled bipolar transistor. The method includes tilt angle implanting a first impurity into a semiconductor substrate and implanting a second impurity into the semiconductor substrate to form an emitter and a collector.

Another embodiment relates to a transistor arranged as to combine the large current drive capacity of a bipolar junction transistor (BJT) with the smaller device size of a metal oxide semiconductor field effect transistor (MOSFET). The transistor includes a semiconductor structure, a gate located proximate the semiconductor structure, a gate insulator disposed intermediate the semiconductor structure and the gate, a source region located in the semiconductor structure, a drain region located in the semiconductor structure, and a buffer region located in the semiconductor structure proximate the drain region.

Another embodiment relates to a method of fabricating a transistor which combines the large current drive capacity of a bipolar junction transistor (BJT) with the smaller device size of a metal oxide semiconductor field effect transistor (MOSFET). The method includes providing a gate stack, large-tilt-angle implanting a first impurity in a semiconductor substrate, and implanting a second impurity to form an emitter and a collector.

Other principle features and advantages of the present invention will become apparent to those skilled in the art upon review of the following drawings, the detailed description, and the appended claims.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENTS

Figure 1:
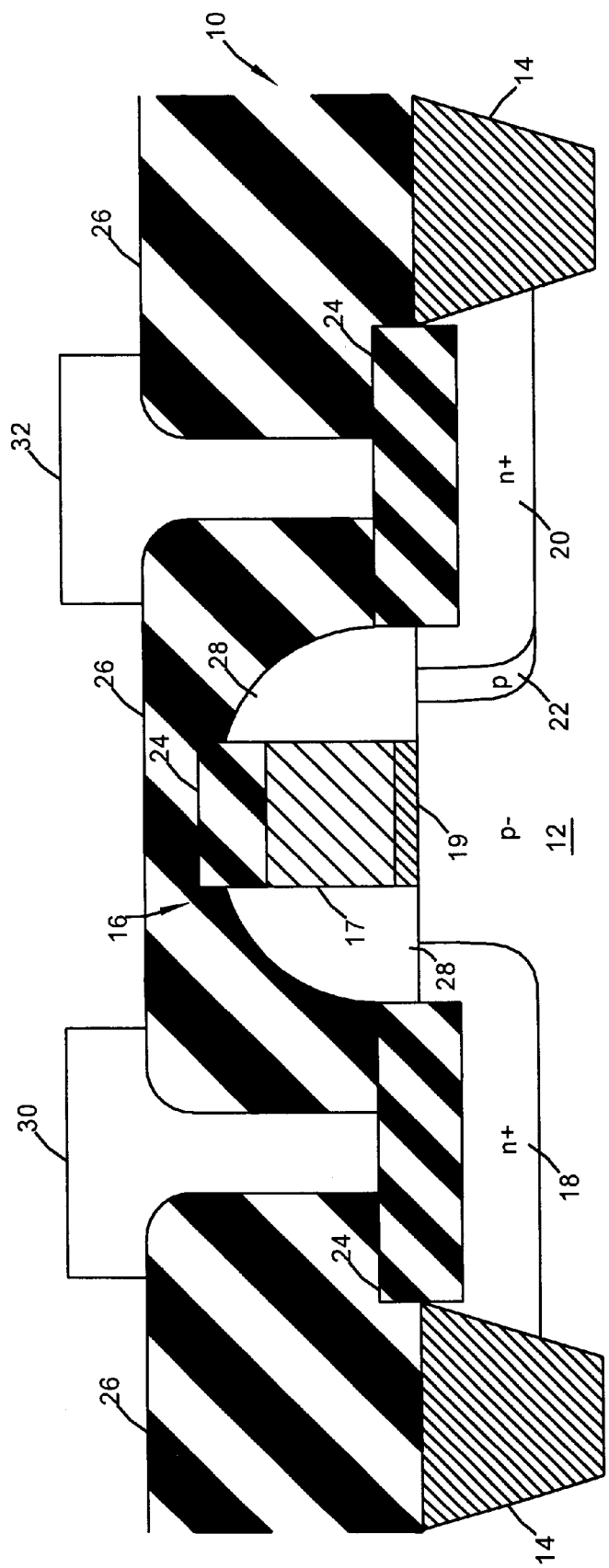
FIG. 1 is a cross-sectional view of a portion of an integrated circuit in accordance with an exemplary embodiment.

Turning to the drawings and referring first to FIG. 1, a cross-sectional view of a portion 10 of an integrated circuit is illustrated in accordance with an exemplary embodiment. Portion 10 is part of a large integrated circuit, such as, an ultra-large scale integrated (ULSI) circuit. Portion 10 includes a substrate 12, isolation regions 14, a base or gate structure 16, a source region or emitter 18, a drain region or collector 20, a buffer region 22, silicide layers 24, an insulating layer 26, spacers 28, an emitter electrode 30, and a collector electrode 32.

Substrate 12 is any of a variety of semiconductor materials. Preferably, the transistor illustrated by portion 10 is fabricated on SOI (silicon-on-insulator) substrate rather than on bulk silicon substrate. With the SOI substrate, the carrier injection from emitter to base in the bottom part of the emitter can be totally eliminated. However, bulk silicon substrates, gallium arsenide (GaAs), germanium, and other semiconductor materials can be utilized as substrate 12.

Isolation regions 14 are shallow trench isolation (STI) structures which divide substrate 12 into a plurality of active regions. The portion of substrate 12 between isolation regions 14 is an active region. Alternatively, field oxidation is used as an isolation process to divide substrate 12 into various active regions.

Gate stack or structure 16 is aligned between source region 18 and drain region 20. Gate structure 16 includes a gate conductor 17 and a gate insulator 19. Gate structure 16 operates as an electrical switch for a stream of electrical charges, or "current," to pass from source region 18 to drain region 20. Source region 18 and drain region 20 are areas in portion 10 including impurities or dopants such as a p-type dopant (e.g., boron) or an n-type dopant (e.g., phosphorous).

Gate insulator 19 is an ultra-thin gate dielectric disposed between substrate 12 and gate conductor 17. In an exemplary embodiment, gate insulator 19 is thermally formed silicon dioxide with a preferred physical thickness of 8–12Å. When a high voltage (Vdd–supply voltage) is applied to gate structure 16, large leakage current flows through gate insulator 19 under a direct tunneling mechanism in the order of 1–100Å/cm$^2$. The injection current through gate insulator 19 into substrate 12 (e.g., the underneath silicon) acts as the base current for the bipolar transistor associated with portion 10.

Source region or emitter 18 and drain region or collector 20 are formed by ion implantation. Gate structure 16 is also doped during the same implantation. The dopant is later activated by thermal activation (i.e., furnace anneal). Source region 18 and drain region 20 are formed such that they have no overlap with gate structure 16. Advantageously, this arrangement reduces or prevents gate-to-emitter or gate-to-collector tunneling leakage.

Buffer region 22 is an area in portion 10 including impurities or dopants such as a p-type dopant (e.g., boron) or an n-type dopant (e.g., phosphorous). Buffer region 22 includes different impurities or dopants than source region 18 and drain region 20. Buffer region 22 is formed near drain region 20 by a large-angle-tilt-angle implant. Buffer region 22 provides for the effects of a p-type region for n-p-n bipolar transistor. Advantageously, buffer region 22 helps to reduce the electric field in the depletion region of base-to-collector junction. As such, it helps avoid base-to-collector junction breakdown as well as punch-through between source region 18 and drain region 20. Buffer region 22 is formed near the base-to-collector or base-to-drain junction because the large-angle-tilt implant is only from the collector or drain side. As such, the transistor illustrated by portion 10 is asymmetrical.

Silicide layers 24 are layers of a material, such as, CoSi$_2$ and TiSi$_2$ formed over source region 18, drain region 20, and gate conductor 17. Preferably, the spacing between silicide and emitter junction needs to be large enough (e.g., 500 Å) to avoid silicide overrun into the emitter depletion region. That is, silicide layer 24 cannot be too deep into source region 18.

Insulating layer 26 is a layer of insulating material disposed over structures including gate structure 16, silicide layers 24, and spacers 28. Insulating layer 26 provides an insulation barrier between structures in portion 10, such as, gate structure 16, emitter electrode 30, and collector electrode 32. Insulation layer 26 can be any of a variety of insulation materials.

Spacers 28 are preferably silicon dioxide (SiO$_2$) structures which abut lateral sides of gate structure 16 and are provided over source region 18, drain region 20, and buffer layer 22. Alternatively, other spacer materials, such as, silicon nitride (Si$_3$N$_4$), silicon oxynitride (SiNO), or other insulators can be used.

Emitter electrode 30 and collector electrode 32 are structures of any of a variety of conductive materials. Emitter electrode 30 extends from the top of the cross section of portion 10 to be in electrical contact with source region 18. Collector electrode 32 extends from the top of the cross-section of portion 10 to be in electrical contact with drain region 20.

In the embodiment shown in FIG. 1, substrate 12 is a lightly doped p-type substrate. Buffer region 22 is a moderately doped p-type region. Source and drain regions 18 and 20 are a heavily doped n-type region. Alternatively, substrate 12 is a lightly doped n-type substrate, buffer region is a moderately doped n-type region, and source and drain regions 18 and 20 are a heavily doped p-type region.

The method of forming portion 10 is described below with reference to FIGS. 1–4. The method advantageously forms portion 10 including buffer layer 22 which provides for the direct tunneling leakage current through gate insulator 19 to act as the base injection current for a lateral bipolar junction transistor. Advantageously, this arrangement combines the large current drive capacity of a BJT with the smaller device size of a MOSFET. It should be noted that while the exemplary method illustrates a n-p-n device, the method equally applies to p-n-p devices. Further, the fabrication process of portion 10 is not only designed for bipolar transistor logic, it can also be designed for bipolar/MOS mixed-mode logic (BiCMOS). Differential gate oxide thickness (dual oxide thickness) is needed in the mixed-mode design. Preferably, differential gate oxide thickness includes a thin gate insulator for gate-injected bipolar transistor operation and a thick gate insulator for regular MOSFET operation.

Figure 2:
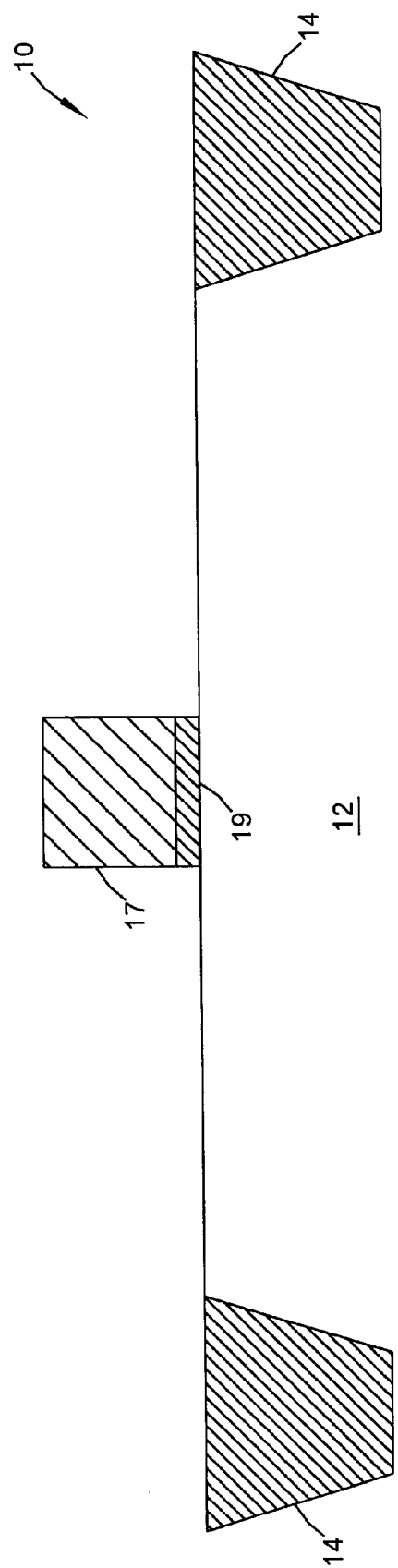
FIG. 2 is a cross-sectional view of the portion of the integrated circuit of FIG. 1, illustrating a shallow trench isolation and gate stack formation step in a method utilized to form a MOS-controlled bipolar transistor in accordance with a preferred embodiment.

In FIG. 2, a cross-sectional view of portion 10 illustrates a shallow trench isolation and gate stack formation step. Preferably, gate structure 16 includes a gate conductor 17 and a gate insulator 19. Gate insulator 19 is preferably an ultra-thin thermal oxide having a 8–12 Å thickness. Gate conductor 17 is preferably an undoped polysilicon material which is 1000–2000 Å thick. Alternatively, conductor 17 can be a refractory metal.

Figure 3:
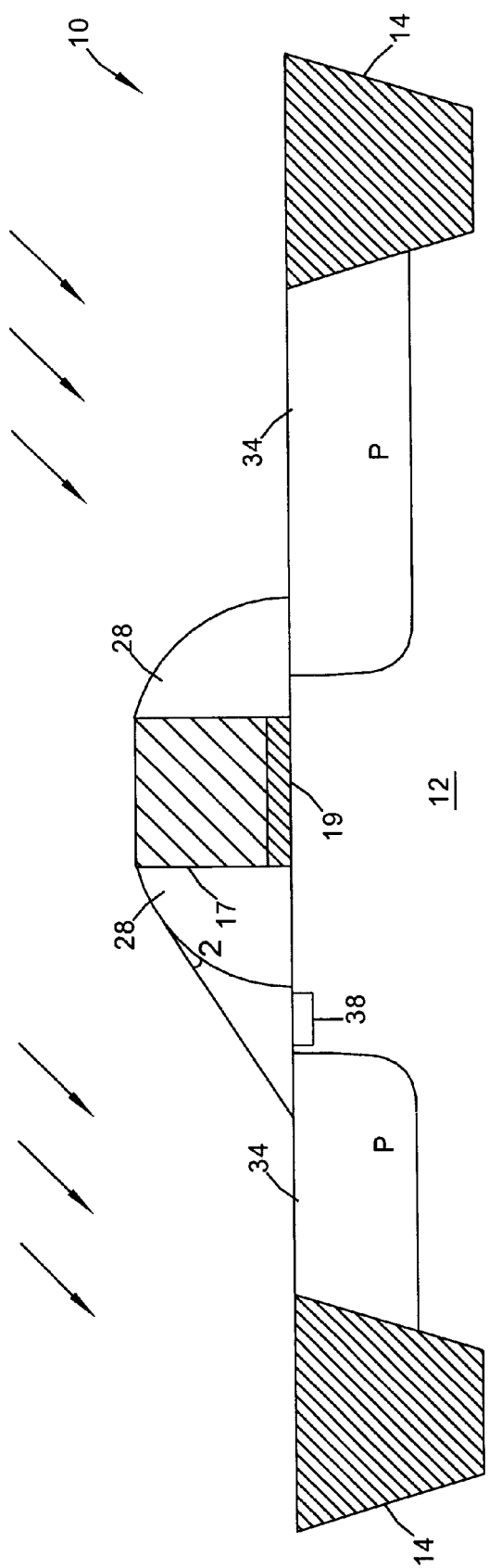
FIG. 3 is a cross-sectional view of the portion of the integrated circuit of FIG. 1, illustrating a spacer formation and tilt-angle buffer layout implant step in the method utilized form a MOS-controlled bipolar transistor.

In FIG. 3, a cross-sectional view of portion 10 illustrates a spacer formation and tilt-angle buffer layout implant step. Spacers 28 are formed on the side walls of gate structure 16. Spacers 28 are oxide or nitride and are preferably formed by a conventional CMOS deposit-and-etchback process. P-type buffer layer 22 is formed by a large-tilt-angle implant of impurities or dopants. Preferably, the large tilt angle, or θ, is 40–60 degrees. The tilt angle implant is made only from the side of drain region 20 by adjusting the wafer rotation angle. Preferably, the implant is made to a depth of 1000–1500 Å and a peak concentration of 1×10$^{20}$ cm$^{-3}$. Further, the type of equipment used for the implant is generally any commercially available ion implantor. An emitter-to-base junction area 38 receives no buffer layer dopant implant because of a gate stack shadowing effect.

Figure 4:
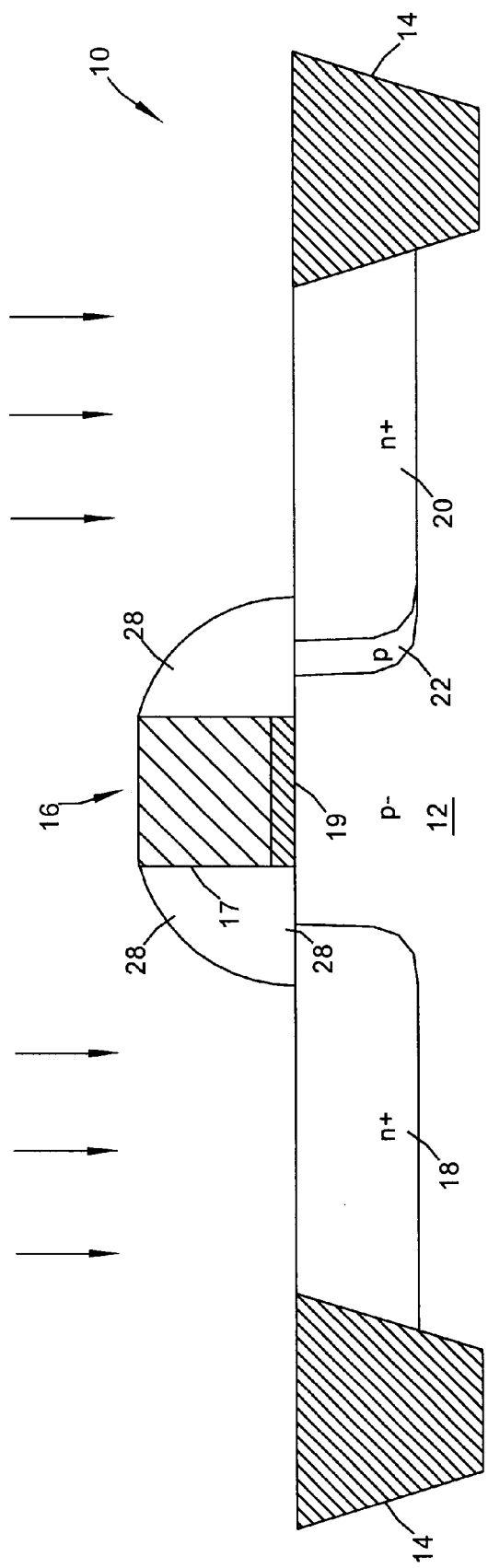
FIG. 4 is a cross-sectional view of the portion of the integrated circuit of FIG. 1, illustrating a emitter and collector implant step in the method utilized to form a MOS-controlled bipolar transistor.

In FIG. 4, a cross-sectional view of portion 10 illustrates a emitter and collector implant step. Source region or emitter 18 and drain region or collector 20 are formed by a 0-degree tilt (vertical) implant. The type of equipment used for the 0-degree tilt implant is generally any commercially available ion implantor. Preferably, source region 18 and drain region 20 have a depth of 1000–1500 Å and a peak concentration of 1×10$^{21}$ cm$^{-3}$. Gate structure 16 is doped at the same time. The implanted dopant is activated by a thermal anneal.

Referring again to FIG. 1, the cross-sectional view of portion 10 illustrates a silicide formation step. Preferably, silicide layer 24 is CoSi$_2$ or TiSi$_2$ and is formed on source region 18, drain region 20, and gate conductor 17. Conventional processes are then followed to form the contact and interconnect, etc., such as, emitter electrode 30 and collector electrode 32.

Advantageously, portion 10 provides a transistor architecture that combines the advantages of MOSFET and BJT, while avoiding the disadvantages of both types of devices. Further, portion 10 utilizes the direct tunneling leakage current through the ultra-thin gate dielectric, gate insulator 19, as the base injection current for a lateral bipolar junction transistor built underneath the gate stack. As such, portion 10 provides a MOS-controlled bipolar transistor. Ordinarily, a BJT is too big for a ULSI circuit. However, portion 10 provides for a BJT structure at a FET size, or a ULSI circuit.

While the embodiments illustrated in the FIGURES and described above are presently preferred, it should be understood that these embodiments are offered by way of example only. Other embodiments may include, for example, different techniques for implanting buffer layer 22. The invention is not limited to a particular embodiment, but extends to various modifications, combinations, and permutations that nevertheless fall within the scope and spirit of the appended claims.

What is claimed is:

1. A method of fabricating a transistor which combines the large current drive capacity of a bipolar junction transistor (BJT) with the smaller device size of a metal oxide semiconductor field effect transistor (MOSFET), the method comprising:

providing a gate stack over a substrate, the gate stack having a left side and a right side;

large-tilt-angle implanting a first impurity in the substrate to form a buffer region on the left side of the gate stack and a buffer region on the right side of the gate stack, the buffer region on the left side of the gate stack being separated by a first distance from the gate stack and the buffer region on the right side of the gate stack being separated by a second distance from the gate stack, the first distance and the second distance being related to the angle of the implant; and implanting a second impurity in the substrate to form an emitter and a collector, the emitter being located proximate the left side of the gate stack and the collector being located proximate the right side of the gate stack, the collector further being separated from the gate stack by the buffer region of the right side of the gate stack.

2. The method of claim 1, wherein the step of forming a gate stack comprises forming an ultra-thin thermal oxide.

3. The method of claim 1, wherein the step of large-tilt-angle implanting a first impurity in the substrate comprises providing the first impurity at an angle between 40 and 60 degrees.

4. The method of claim 3, wherein the step of implanting a second impurity to form an emitter and a collector comprises forming the collector such that the buffer region on the right side of the gate stack at least partially remains.

5. The method of claim 1, further comprising forming silicide on the emitter, collector, and gate stack.

\* \* \* \* \*